United States Patent [19]

Sawada et al.

[11] Patent Number: 4,506,220
[45] Date of Patent: Mar. 19, 1985

[54] TEMPERATURE COMPENSATED MAGNETORESISTIVE EFFECT THIN FILM MAGNETIC SENSOR

[75] Inventors: Takeshi Sawada, Yokohama; Kou Yoneda, Kawasaki; Akira Shinmi, Kawasaki; Hiroshi Takagi, Kawasaki; Shuzo Abiko, Chichibu; Hirokazu Goto, Tokyo, all of Japan

[73] Assignees: Canon Kabushiki Kaisha, Tokyo; Canon Denshi Kabushiki Kaisha, Saitama, both of Japan

[21] Appl. No.: 317,386

[22] Filed: Nov. 2, 1981

[30] Foreign Application Priority Data

Nov. 10, 1980 [JP] Japan .................. 55-157066
Nov. 10, 1980 [JP] Japan .................. 55-157067
Nov. 13, 1980 [JP] Japan .................. 55-158823

[51] Int. Cl.³ .................. G01R 33/06; H01L 43/08
[52] U.S. Cl. .................. 324/252; 324/225; 338/32 R
[58] Field of Search .................. 324/224, 225, 252; 360/113; 365/158; 338/32 R

[56] References Cited

U.S. PATENT DOCUMENTS

| | | | |
|---|---|---|---|
| 3,979,775 | 9/1976 | Schwarz | 324/252 X |
| 4,047,236 | 9/1977 | Lee | 338/32 R X |
| 4,142,218 | 2/1979 | Gorter | 324/252 X |
| 4,212,041 | 7/1980 | Lazzari et al. | 360/113 |
| 4,277,808 | 7/1981 | Nagaki | 324/252 X |
| 4,280,158 | 7/1981 | de Niet | 360/113 |
| 4,296,377 | 10/1981 | Ohkubo | 324/252 |

Primary Examiner—Gerard R. Strecker
Attorney, Agent, or Firm—Fitzpatrick, Cella, Harper & Scinto

[57] ABSTRACT

A magnetoresistive effect thin film magnetic sensor has a temperature compensating magnetoresistive effect (MR) element arranged non-parallel to a signal detecting MR element to prevent the temperature compensating MR element from being influenced by an external magnetic signal field. Alternatively, it has an L-shaped temperature compensating MR element arranged closely to the signal detecting MR element to prevent the temperature compensating MR element from being influenced by the external magnetic signal field. It further has a magnet member arranged closely to or in contact with the temperature compensating MR element to enhance a positional precision of the temperature compensation and reduce a time lag.

8 Claims, 12 Drawing Figures

TEMPERATURE COMPENSATED MAGNETORESISTIVE EFFECT THIN FILM MAGNETIC SENSOR

BACKGROUND OF THE INVENTION

1. Field of the Invention

The present invention relates to a temperature compensated magnetoresistive effect thin film magnetic sensor.

2. Description of the Prior Art

Thin film magnetic sensors (MR sensors) utilizing the magnetoresistive effect (MR effect) elements such as Ni-Fe alloy and Ni-Co alloy have been well known but since the resistances of those MR elements are temperature-dependent they need the temperature compensation.

A structure of a conventional temperature compensated thin film magnetic sensor is shown in FIG. 1, in which numeral 1 denotes a glass substrate on which a metal exhibiting the MR effect such as the alloy mentioned above is deposited by a thin film deposition process with a magnetic anisotropic axis thereof being oriented in the direction of an arrow A and tailored by a photolithography technique to form simultaneously a magnetic signal detecting MR element 2 and a temperature compensating MR element 3 spaced therefrom by a predetermined distance.

After the formation of the MR elements 2 and 3, electrodes 4 are electrically connected by the thin film deposition process or the photolithography process to complete the MR sensor.

Before the MR sensor thus formed is packaged, a protective layer is deposited, a cover glass is attached, ends thereof are cut or polished as required.

FIG. 2 shows an exemplary circuit which uses the MR sensor thus formed.

Referring to FIG. 2, $MR_1$ and $MR_2$ correspond to the detecting MR sensor 2 and the temperature compensating MR sensor 3, respectively, and Ra and Rb represent resistors. These elements form a bridge circuit as a whole.

A balanced condition of the bridge circuit of FIG. 2 is given by the following formula (1);

$$MR_1 \times Rb = MR_2 \times Ra \qquad (1)$$

In the formula (1), when no magnetic signal field is applied to $MR_1$ at a given temperature, a voltage V is zero, and when a magnetic signal field is applied to $MR_1$, the resistance of the detecting MR element $MR_1$ changes so that the voltage V changes to produce an output signal. If the resistance of the temperature compensating MR element $MR_2$ also changes by the magnetic signal field, an error is produced in the output signal.

Accordingly, in the conventional temperature compensated MR sensor, the detecting MR sensor 2 must be spaced from the temperature compensating MR sensor 3 in order to prevent the resistance of the temperature compensating MR element from being influenced by the external magnetic signal field.

For example, when the detecting MR sensor 2 has a width w of 20 μm and a length l of 150 μm, a spacing p of no less than 250 μm is required between the MR sensors 2 and 3.

As a result, the conventional MR sensor has many defects such as large size, low positional precision of the temperature compensation and a time lag in the temperature compensation.

SUMMARY OF THE INVENTION

It is a first object of the present invention to provide a thin film magnetic sensor which is simple in structure and small in size.

It is a second object of the present invention to provide a thin film magnetic sensor which has an increased positional precision of the temperature compensation and a reduced time lag in temperature compensation.

It is a third object of the present invention to provide a thin film magnetic sensor having a temperature compensating MR element which is hardly influenced by an external magnetic field.

It is a fourth object of the present invention to provide a thin film magnetic sensor having a temperature compensating MR element which is highly sensitive to a temperature to enhance a temperature compensation effect.

DETAILED DESCRIPTION OF THE PREFERRED EMBODIMENTS

Figure 1:
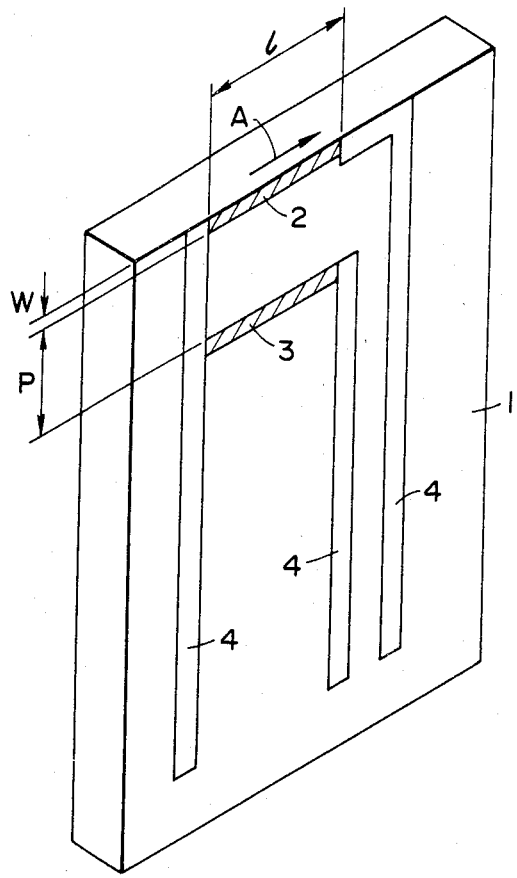
FIG. 1 shows a perspective view of a conventional MR sensor.
Figure 3:
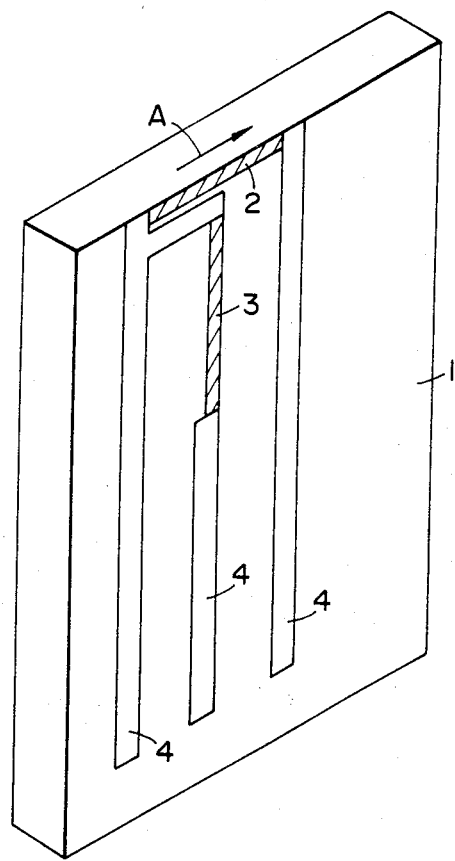
FIG. 3 shows a perspective view of a first embodiment of the present invention.

FIG. 3 illustrates a first embodiment of the present invention. In FIG. 3, like or corresponding elements to those shown in FIG. 1 are designated by the like numerals and they are not explained here.

In the present embodiment, the temperature compensating MR element 3 is arranged substantially orthogonally to the detecting MR element 2 and has a width of 20~40 μm. The magnetic anisotropic axes of the MR elements 2 and 3 are oriented in the direction shown by the arrow A of FIG. 3. With this structure, the temperature compensating MR element 3 is not influenced by the external magnetic signal field by the reason which will be explained below.

Figure 4:
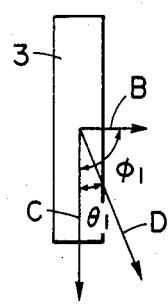
FIG. 4 illustrates magnetization directions of a temperature compensating MR element shown in FIG. 3.

Referring now to FIG. 4, when a current flows in the MR element 3 in the direction shown by an arrow C, an easy magnetization axis of the MR element 3 is in the direction shown by an arrow B and an angle $\phi_1$ between those directions is equal to 90 degrees. A magnetization energy E is expressed by the following formula (2);

$$E = -Ku \sin^2\left(\frac{\pi}{2} - \theta_1\right) + \tfrac{1}{2} M Hd \cos\left(\frac{\pi}{2} + \theta_1\right) \qquad (2)$$

where $\theta_1$ is an angle between a magnetization direction shown by an arrow D and the current direction shown by the arrow C, Ku is a magnetic anisotropy constant, M is a magnitude of magnetization and Hd is a back magnetic field due to a shape anisotropy and expressed by the following formula (3);

$$Hd = \frac{t}{w} M \sin\theta_1 \qquad (3)$$

where t is a thickness of the MR element and w is a width of the MR element. From the formulas (2) and (3), the magnetization energy E is expressed as follows:

$$E = -Ku \sin^2\left(\frac{\pi}{2} - \theta_1\right) - \frac{1}{2}M^2 \frac{t}{w} \sin^2\theta_1 \qquad (4)$$

The magnetization stabilizes at an angle $\theta$ which provides a minimum value in the energy formula (4). Thus, the magnetization stabilizes when the differentiation of the formula (4) is equal to zero as shown in the following formula (5);

$$\frac{\partial E}{\partial \theta} = 2Ku \sin\theta_1 \cos\theta_1 - M^2 \frac{t}{w} \sin\theta_1 \cos\theta_1 = 0 \qquad (5)$$

From the formula (5), it is seen that the magnetization M stabilizes when $\theta_1 = 0$ or $\theta_1 = \pi/2$, and when $Hd > Hk$ $\theta_1 = 0$ \qquad (6)

when $Hd < Hk$ $\theta_1 = \pi/2$ \qquad (7)

Accordingly, if the back magnetic field Hd is larger than the anisotropic magnetic field Hk, the direction of the magnetization M corresponds to the direction of the current. Since the magnetic signal field is always in the direction of the current in the MR element 3, the magnetic signal field causes no change. That is, $\theta_1 = 0$.

In ordinary cases, the film thickness of the MR element is between 0.05 μm and 0.1 μm, Hk is between 5 oersteds and 10 oersteds, and the magnitude of the magnetization $4\pi MS$ is in the order of 8000 gausses, and the width of the MR element 3 is preferably no larger than 40 μm in order for the back magnetic field Hd to be sufficiently larger than Hk. When the MR elements 2 and 3 are arranged orthogonally to each other and Hd is larger than Hk, the temperature compensating MR element 3 does not pick up the magnetic signal field however closely they are arranged to each other.

According to the present embodiment, the change in the resistance of the temperature compensating MR element by the magnetic signal field is prevented and the temperature compensated MR sensor using the present MR elements has many advantages, that is, it is simple in structure, small in size, enhances the precision of the temperature compensation because the detecting MR element and the temperature compensating MR element are arranged closely to each other, and has no time lag in the temperature compensation.

Figure 5:
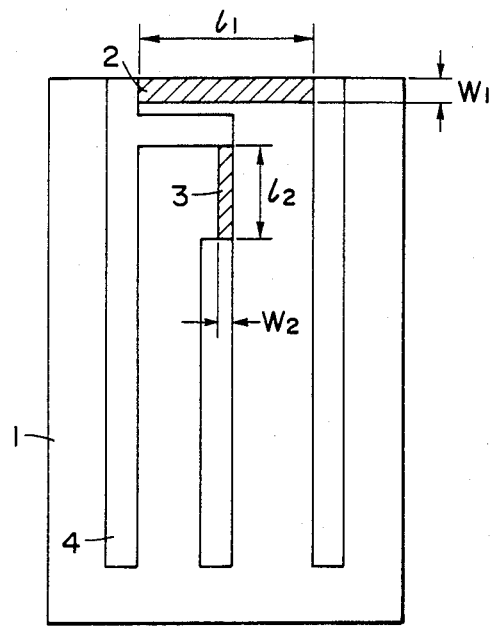
FIG. 5 shows a plan view of a second embodiment of the present invention.

FIG. 5 shows a second embodiment of the present invention. In the present embodiment, the temperature compensating MR element 3 and the detecting MR element 2 are analogous in shape and the MR element 3 has a width $w_2$ of no larger than 40 μm so that Hd becomes larger than Hk.

When the MR elements 2 and 3 are analogous in shape, the resistance $R_1$ of the MR element 2 and the resistance $R_2$ of the MR element 3 are given by:

$$R_1 = \rho_1 \frac{l_1}{t_1 w_1} \qquad (8)$$

$$R_2 = \rho_2 \frac{l_2}{t_2 w_2} \qquad (9)$$

where $\rho$ is a specific resistance. When the MR elements 2 and 3 are simultaneously formed, $\rho_1 = \rho_2$ and $t_1 = t_2$, and since the MR elements 2 and 3 are analogous in shape $l_1/w_1 = l_2/w_2$ where $l_1$ and $l_2$ are lengths of the MR elements and $w_1$ and $w_2$ are widths thereof. Accordingly, $R_1$ is equal to $R_2$. In addition, the back magnetic field of the MR element 3 can be controlled to any desired strength.

Figure 2:
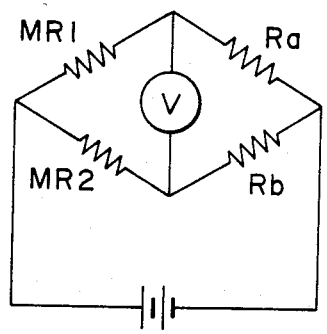
FIG. 2 shows an electrical circuit diagram which uses the sensors shown in FIG. 1.

Thus, in the circuit shown in FIG. 2, Ra=Rb so that the bridge can be readily balanced and an output can be produced in the most efficient way for the change in the resistance of the detecting MR element 2.

In the first and second embodiments, while the MR elements are arranged orthogonally to each other, the angle therebetween is not limited to the right angle and the influence by the magnetic signal field can be substantially eliminated when the angle is close to the right angle. Even with other angles (non-parallel), the influence by the magnetic signal field can be eliminated more or less depending on a particular angle.

Figure 6:
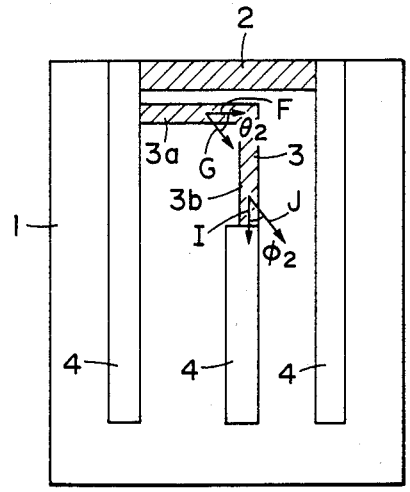
FIGS. 6 to 10 show plan views of third to seventh embodiments of the present invention, respectively.

FIG. 6 shows a third embodiment of the present invention. Like or corresponding elements to those shown in FIG. 1 are designated by the like numerals and they are not explained here.

In the embodiment of FIG. 6, the temperature compensating MR element 3 is of right angle L-shape having a section 3a which is parallel to the magnetic signal field detecting MR element 2 and a section 3b which is orthogonal to the MR element 3.

In FIG. 6, a direction of a current flowing through the section 3a is shown by an arrow F, a direction of magnetization in the section 3a is shown by an arrow G and an angle between those directions is shown by $\theta_2$. Thus, a resistance Ra of the section 3a is given by:

$$Ra = Ro + \Delta R \cos^2\theta_2 \qquad (10)$$

where Ro is a minimum resistance of the horizontal section 3a of the MR element 3 and $\Delta R$ is a maximum resistance increment of the horizontal section 3a.

If the shape of the vertical section 3b is exactly the same as that of the horizontal section 3a, a resistance Rb of the section 3b is given by:

$$Rb = Ro + \Delta R \cos^2\phi_2 \qquad (11)$$

where $\phi_2$ is an angle between a direction I of a current flowing through the section 3b and a direction J of the magnetization of the section 3b. Since the $\phi_2 + \theta_2 = 90°$, we get;

$$Ra + Rb = 2Ro + \Delta R (\cos^2\theta_2 + \cos^2\phi_2) \qquad (12)$$
$$= 2Ro + \Delta R (\cos^2\theta_2 + \sin^2\theta_2) = \text{constant}$$

Accordingly, the total resistance of the sections 3a and 3b of the MR element 3 is constant independently of the strength of the magnetic signal field. Thus, when the temperature compensating MR element 3 has the L-shape, the resistance of the MR element 3 is insensitive to the magnetic signal field and it changes only with the temperature.

Figure 7:
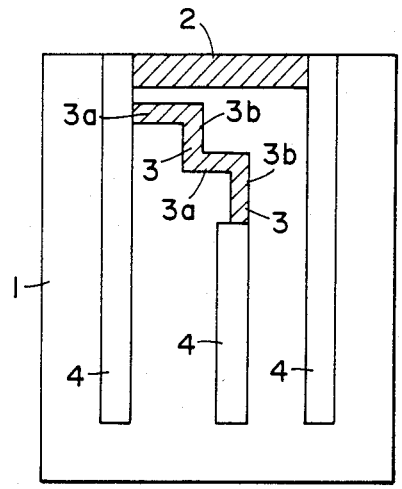

FIG. 7 shows a fourth embodiment of the present invention. In the present embodiment, the temperature compensating MR element 3 is bent to have two L-shaped sections. This structure provides the same effect as that attained by the embodiment of FIG. 6.

Figure 8:
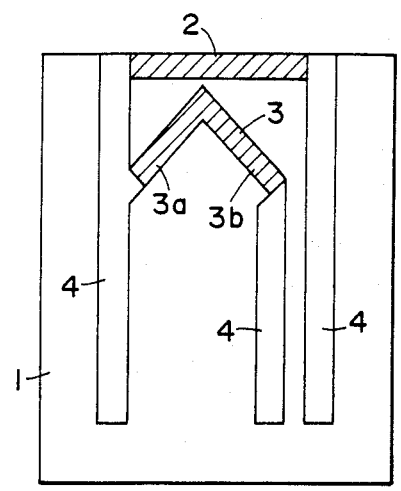

FIG. 8 shows a fifth embodiment of the present invention. In the present embodiment, the L-shaped temperature compensating MR element 3 is arranged in hill pattern. This structure also provides the same effect as that attained in the previous embodiments.

Figure 9:
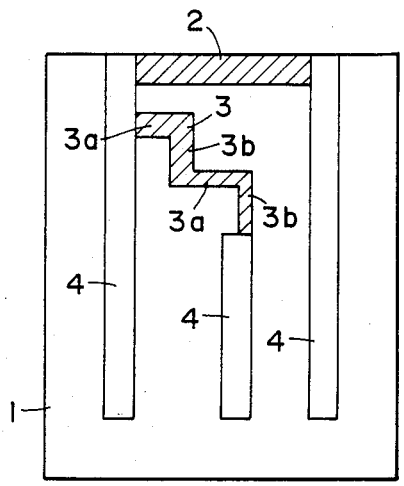

FIG. 9 shows a sixth embodiment of the present invention. In the present embodiment, the MR element 3 comprises two contiguous L-shaped patterns with the width and the length of the horizontal sections $3a$ being different from those of the vertical sections $3b$. This structure also provides the same effect as that attained in the previous embodiments.

Figure 10:
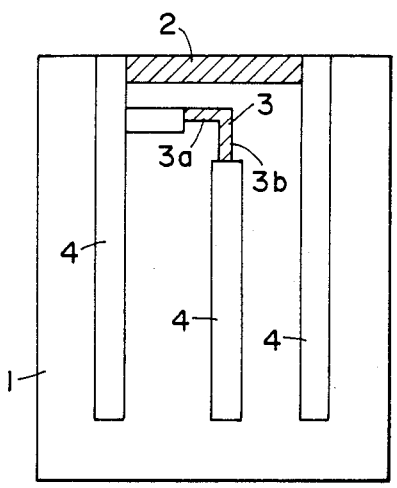

FIG. 10 shows a seventh embodiment of the present invention. In the present embodiment, the temperature compensating MR element 3 has the L-shape having the horizontal section $3a$ and the vertical section $3b$ with a ratio of the width to the length of the MR element 3 being equal to that of the magnetic signal field detecting MR element 2, that is, the MR element 3 being analogous to the MR element 2. With this arrangement, the resistance of the MR element 2 is equal to the resistance of the MR element 3.

When the MR elements 2 and 3 are analogous in shape, the resistance $R_1$ of the MR element 2 and the resistance $R_2$ of the MR element 3 are given by:

$$R_1 = \rho_1 \frac{l_1}{t_1 w_1} \quad (13)$$

$$R_2 = \rho_2 \frac{l_2}{t_2 w_2} \quad (14)$$

where $\rho$ is a specific resistance. When the MR elements 2 and 3 are simultaneously formed by the thin film deposition process, $\rho_1 = \rho_2$ and $t_1 = t_2$ and $l_1/w_1 = l_2/w_2$. Accordingly, $R_1$ is equal to $R_2$.

With this arrangement, Ra=Rb in the circuit shown in FIG. 2. Thus, the simplest circuit configuration is attained. In addition, the MR element 3 can be placed in proximity to the MR element 2. Consequently, the magnetic signal field can be detected precisely with a small size structure.

Figure 11:
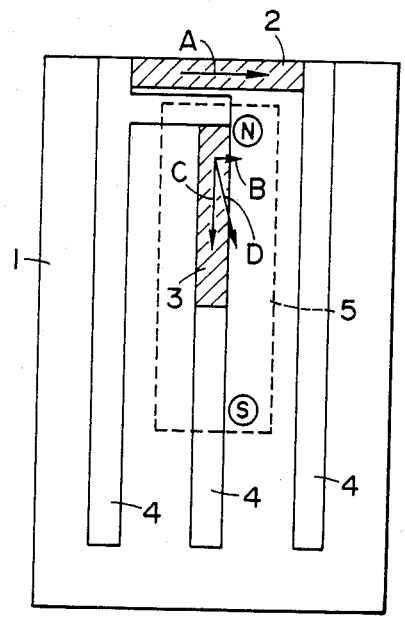
FIG. 11 shows a plan view of an eighth embodiment of the present invention.

FIG. 11 shows an eighth embodiment of the present invention. Like or corresponding elements to those shown in FIG. 1 are designated by the like numerals and they are not explained here.

In the embodiment of FIG. 11, the detecting MR element 2 and the temperature compensating MR element 3 are arranged such that their axial lines are substantially orthogonal to each other.

In general, a magnetic biasing field $H_B$ (not shown) is required to maintain a linear relation between the magnetic signal field of the MR element and the resistance of the MR element. In the present embodiment, a permanent magnet 5 shown by a broken line is provided to supply the D.C. magnetic field.

When the permanent magnet 5 is located above the temperature compensating MR element 3, the MR element 3 is subjected to a very strong magnetic field by the permanent magnet 5. This magnetic field is shown by an arrow C in FIG. 11. Under the influence of the strong magnetic field, the current flowing in the temperature compensating MR element 3 is deflected to a direction which does not coincide with the axial direction of the MR element 3 as shown exaggeratedly by an arrow D. Consequently, the resistance of the MR element 3 is not influenced by the external magnetic signal field and the MR sensor exhibits a high linearity in the temperature compensation.

In the embodiment of FIG. 11, the permanent magnet 5 is relatively larger than the MR element 2, as a result, the size of the MR sensor cannot be reduced so much and it is difficult to prevent the magnetic field generated by the permanent magnet 5 from affecting the MR element 2.

Figure 12:
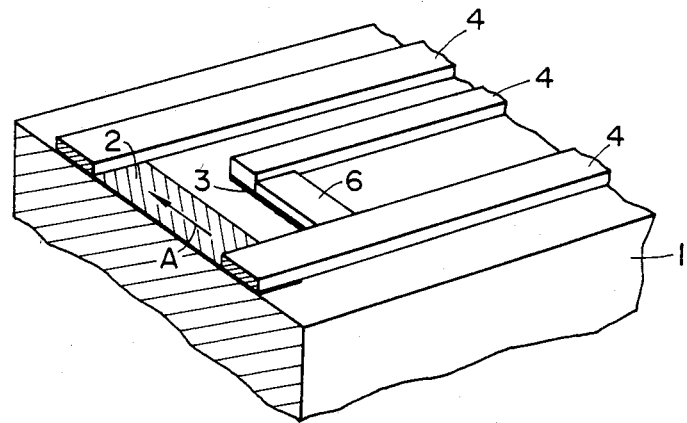
FIG. 12 shows a perspective view of a ninth embodiment of the present invention.

FIG. 12 shows a ninth embodiment of the present invention which has an improved permanent magnet structure. In the present embodiment, the temperature compensating MR element 3 is arranged substantially parallel to the detecting MR element 2 and a permanent magnet 6 is formed by the thin film deposition process on the MR element 3 in proximity to or in contact with the MR element 2. The permanent magnet 6 is made of ferrite material having a large specific resistance.

When the permanent magnet 6 is formed as the thin film, the MR element 3 which is made of high permeability material acts as a magnetic circuit which permeates the magnetic fluxes from the permanent magnet 6 and very few magnetic fluxes leak externally. In addition, the direction of the magnetization of the MR element 3 is fixed by the magnetic field of the permanent magnet and hence the resistance of the MR element 3 does not change with the magnetic signal field.

On the other hand, since the film thickness of the permanent magnet is $0.5 \sim 1$ $\mu$m, most of the magnetic fluxes from the permanent magnet 6 are shunted by the MR element 3 and they do not act as a magnetic biasing field at a point displaced by several $\mu$m. The MR element 2 is not influenced even if it is placed in very closely.

By substantially aligning the direction of the magnetization of the permanent magnet 6 to the easy magnetization axis of the MR element 3, the magnetization direction of the MR element 3 can be very stably fixed with respect to the magnetic signal field, and no magnetic biasing field need be applied to the MR element 2.

As described hereinabove, according to the present invention, the temperature compensating MR element can be constructed to be insensitive to the magnetic signal field, and the detecting MR element and the temperature compensating MR element can be arranged very closely to each other. Accordingly, the temperature compensated MR sensor of the present invention has many advantages such as it is simple in structure, small in size, enhances the precision in the temperature compensation, and has no time lag in the temperature compensation because the temperature sensing MR element is arranged in proximity to the detecting MR element.

What we claim is:

1. A temperature compensated magnetoresistive effect thin film magnetic sensor, comprising:
   a base having a surface on which may be formed elements defining a thin film magnetic sensor;
   a first magnetoresistive effect element formed on said base, having opposing ends and a predetermined length in the direction of an anisotropic magnetic field for detecting a magnetic signal;

an L-shaped second magnetoresistive effect element formed on said base, having opposing ends, a first section substantially parallel to said first magnetoresistive effect element, and a second section substantially orthogonal to said first magnetoresistive effect element, the resistance of said second magnetoresistive effect element varying in response to changes in temperature;

a first electrode connecting one end of said first magnetoresistive effect element to one end of said second magnetoresistive effect element;

a second electrode connected to the other end of said first magnetoresistive effect element; and a third electrode connected to the other end of the said second magnetoresistive effect element, said first, second, and third electrodes being for applying a voltage to said first and said second magnetoresistive effect elements, respectively.

2. A temperature compensated magnetoresistive effect thin film magnetic sensor according to claim 1, wherein said second magnetoresistive effect element has a constant total resistance for each section of the L shape thereof.

3. A temperature compensated magnetoresistive effect thin film magnetic sensor according to claim 1 or 2, wherein said second magnetoresistive effect element and said first magnetoresistive effect element have equal ratios of length to width.

4. A temperature compensated magnetoresistive effect thin film magnetic sensor according to claim 1, wherein said second magnetoresistive effect element comprises a plurality of series-connected L-shaped patterns.

5. A temperature compensated magnetoresistive effect thin film magnetic sensor according to claim 4, wherein in said second magnetoresistive effect element comprising a plurality of L-shaped patterns, the length of a section substantially orthogonal to said first magnetoresistive effect element is different than the length of a section substantially parallel to said first magnetoresistive effect element.

6. A temperature compensated magnetoresistive effect thin film magnetic sensor according to claim 4, wherein in said second magnetoresistive effect element comprising a plurality of L-shaped patterns the width of a section substantially normal to said first magnetoresistive effect element is different than the width of a section substantially parallel to said first magnetoresistive effect element.

7. A temperature compensated magnetoresistive effect thin film magnetic sensor according to claim 1 or 4, wherein said first magnetoresistive effect element is of a width smaller than that of said third electrode.

8. A temperature compensated magnetoresistive effect thin film magnetic sensor, comprising:

a base having a surface on which may be formed elements defining a thin film magnetic sensor;

a first magnetoresistive effect element formed on said base, having a predetermined length in the direction of an anisotropic magnetic field for detecting a magnetic signal;

an L-shaped second magnetoresistive effect element formed on said base, having two sections each non-parallel to said first magnetoresistive effect element, the resistance of said second magnetoresistive effect element varying in response to changes in temperature; and a plurality of electrodes formed on said base, each of said electrodes being connected to one end of at least one of said first and said second magnetoresistive effect elements for applying voltage to said first magnetoresistive effect element and said second magnetoresistive effect element, respectively.

* * * * *